United States Patent [19]

Chandra et al.

[11] Patent Number: 5,262,201
[45] Date of Patent: * Nov. 16, 1993

[54] LOW TEMPERATURE PROCESS FOR CONVERTING SILICA PRECURSOR COATINGS TO CERAMIC SILICA COATINGS BY EXPOSURE TO AMMONIUM HYDROXIDE OR AN ENVIRONMENT TO WHICH WATER VAPOR AND AMMONIA VAPOR HAVE BEEN ADDED

[75] Inventors: Grish Chandra; Loren A. Haluska; Keith W. Michael; Carl J. Bilgrien, all of Midland, Mich.

[73] Assignee: Dow Corning Corporation, Midland, Mich.

[*] Notice: The portion of the term of this patent subsequent to Jul. 11, 2006 has been disclaimed.

[21] Appl. No.: 532,828

[22] Filed: Jun. 4, 1990

[51] Int. Cl.$^5$ .................................. B05P 3/02
[52] U.S. Cl. ........................ 427/376.2; 427/377; 427/387
[58] Field of Search ............... 427/387, 376.2, 377

[56] References Cited

U.S. PATENT DOCUMENTS

| | | | |
|---|---|---|---|
| 4,471,007 | 9/1984 | Pate | 427/377 |
| 4,636,440 | 1/1987 | Jada | 428/446 |
| 4,678,688 | 7/1987 | Itoh et al. | 427/387 |
| 4,749,631 | 7/1988 | Haluska et al. | 428/704 |
| 4,756,977 | 6/1988 | Haluska et al. | 427/704 |
| 4,842,888 | 6/1989 | Haluska et al. | 427/38 |
| 4,847,162 | 6/1989 | Haluska et al. | 428/457 |

OTHER PUBLICATIONS

Glasser and Pantano, Jnl Non-Crystalline Solids 64 209-221 (1984).
Hackh's Chemical Dictionary 4th edition McGraw Hill Book Co, 1969 p. 25.

*Primary Examiner*—Shrive Beck
*Assistant Examiner*—Benjamin L. Utech
*Attorney, Agent, or Firm*—Roger E. Gobrogge

[57] ABSTRACT

This invention relates to a method of forming a ceramic coating on a substrate. The method comprises coating the substrate with a solution comprising a solvent and a silica precursor followed by evaporating the solvent to form a preceramic coating. The preceramic coating is then exposed to an environment comprising ammonium hydroxide or an environment to which water vapor and ammonia vapor have been added to facilitate conversion of the silica precursor to the ceramic coating. The preceramic coating is then subjected to a temperature sufficient to facilitate conversion of said preceramic coating to a ceramic coating.

35 Claims, No Drawings

LOW TEMPERATURE PROCESS FOR CONVERTING SILICA PRECURSOR COATINGS TO CERAMIC SILICA COATINGS BY EXPOSURE TO AMMONIUM HYDROXIDE OR AN ENVIRONMENT TO WHICH WATER VAPOR AND AMMONIA VAPOR HAVE BEEN ADDED

BACKGROUND OF THE INVENTION

This invention relates to a low temperature method of converting silica precursor coatings to ceramic silica coatings. The method comprises applying a silica precursor coating to a substrate, exposing the coating to an environment comprising ammonium hydroxide and/or wet ammonia vapors and subjecting the coating to a temperature sufficient to yield the ceramic coating. The methods of the invention are particularly applicable to applying coatings on electronic devices.

Researchers have recently shown that thin film ceramic coatings on electronic devices and circuits are valuable for their protective and dielectric effect. As protective agents, these thin films can assure reliability and extended service life of the electronics under a variety of environmental conditions and stresses such as moisture, heat and abrasion. As dielectric agents, these films can inhibit electrical conduction in many applications such as in multilayer devices where they function as interlevel dielectrics.

The art suggests several methods for the application of these ceramic coatings. For instance, Haluska et al. in U.S. Pat. Nos. 4,749,631 and 4,756,977, which are incorporated herein by reference, disclose silica based coatings produced by applying solutions of silicon alkoxides or hydrogen silsesquioxane, respectively, to a substrate and then heating to temperatures of 200°-1000° C. These same references also describe the application of other silicon-containing coatings such as silicon carbide, silicon nitride or silicon carbonitride onto the initial silica layer for added protection or dielectric effect. The ceramic coatings produced thereby have many desirable characteristics such as microhardness, moisture resistance, ion barrier, adhesion, ductility, tensile strength, low electrical conductance and thermal expansion coefficient matching that make these coatings especially valuable.

Haluska et al. in U.S. Pat. Nos. 4,847,162 and 4,842,888 also teach the formation of nitrided silica coatings by heating hydrogen silsesquioxane resin and silicate esters, respectively, to a temperature of between 200° and 1000° C. in the presence of ammonia. These references, however, teach that the ammonia should be anhydrous and that the resulting coating has about 1 to 2% by weight nitrogen incorporated therein.

Glasser et al. in the Journal of Non-Crystalline Solids, 64 (1984) pp. 209-221 teach the formation of ceramic coatings by heating tetraethoxysilane in the presence of ammonia. As with Haluska '162 above, however, this reference also teaches that the ammonia should be anhydrous and that the resultant silica coatings are nitrided.

Despite the efficacy of the above coatings, ceramification at temperatures less than 400° C. is so slow that commercial applications are impractical. Utilizing temperatures in excess of 400° C., on the other hand, can destroy various temperature sensitive devices. Therefore, a need exists for a method of rapidly applying ceramic coatings at low temperatures.

Jada in U.S. Pat. No. 4,636,440 discloses a method of reducing the drying time for a sol-gel coated substrate comprising exposing the substrate to aqueous quaternary ammonium hydroxide and/or alkanol amine compounds. The methods of this reference, however, are different than that disclosed herein in that Jada requires the coating to be dried prior to heating. Moreover, Jada is specifically limited to hydrolyzed or partially hydrolyzed silicon alkoxides and fails to teach the utility of the process on a coating of hydrogen silsesquioxane. As such, it is surprising and unexpected that the use of wet ammonia vapors and/or ammonium hydroxide, as taught herein catalyzes both the hydrolysis of Si—H bonds to Si—OH bonds and the condensation of Si—OH bonds to Si—O—Si.

The present inventors have now discovered that by exposing a silica precursor to ammonium hydroxide and/or wet ammonia vapors. a ceramic silica coating can be obtained on various substrates, including electronic devices, at temperatures as low as room temperature.

SUMMARY OF THE INVENTION

This invention relates to a method of forming a ceramic coating on a substrate. The method comprises coating the substrate with a solution comprising a solvent and hydrogen silsesquioxane resin. The solvent is then evaporated to deposit a preceramic coating. The preceramic coating is exposed to an environment comprising ammonium hydroxide, wet ammonia vapors, or combinations thereof and then subjected to a temperature sufficient for ceramification.

This invention also relates to a method of forming a ceramic coating on a substrate comprising coating said substrate with a solution comprising a solvent and hydrolyzed or partially hydrolyzed $R_xSi(OR)_{4-x}$, in which R is an aliphatic, alicyclic or aromatic substituent of 1-20 carbon atoms and x is 0-2. The solvent is evaporated to deposit a preceramic coating on said substrate. The preceramic coating is exposed to an environment comprising ammonium hydroxide, wet ammonia vapors, or combinations thereof and then subjected to a temperature above room temperature for ceramification.

DETAILED DESCRIPTION OF THE INVENTION

The present invention is based on the discovery that ammonium hydroxide and/or wet ammonia vapors can assist in converting silica precursors to ceramic silica coatings at low temperatures. The ammonium hydroxide and/or wet ammonia atmospheres herein are thought to act as catalysts in the hydrolysis and/or condensation of SiH, SiOR and SiOH bonds.

The methods of this invention are particularly applicable to the deposition of protective or dielectric coatings on electronic devices, electronic circuits or plastics including, for example, polyimides, epoxies, polytetrafluoroethylene and copolymers thereof, polycarbonates, acrylics and polyesters. However, the choice of substrates and devices to be coated by the instant invention is limited only by the need for thermal and chemical stability of the substrate at the temperature and atmosphere used in the present invention. The coatings taught herein also may serve as interlevel dielectric layers, doped dielectric layers to produce transistor like devices, pigment loaded binder systems containing silicon to produce capacitor and capacitor like devices, multilayer devices. 3-D devices, silicon on insulator devices, super lattice devices, protective layers for high temperature superconductors and the like.

As used in the present invention, the expression "ceramic" includes ceramics such as amorphous silica and ceramic-like materials such as amorphous silica-like materials that are not fully free of residual carbon and/or hydrogen but are otherwise ceramic in character; the expressions "hydrogen silsesquioxane resin" or "H-resin" are meant to include those resins which are fully condensed $(HSiO_{3/2})_n$ as well as those which are only partially hydrolyzed and/or partially condensed and, thereby, may contain residual Si—OR and/or Si—OH substituents; and the expressions "electronic device" or "electronic circuit" include, but are not limited to, silicon based devices, gallium arsenide based devices, focal plane arrays, opto-electronic devices, photovoltaic cells and optical devices.

The silica precursors that are useful in the invention include hydrogen silsesquioxane resin (H-resin), hydrolyzed or partially hydrolyzed $R_xSi(OR)_{4-x}$, or combinations of the above materials, in which R is an aliphatic, alicyclic or aromatic substituent of 1-20 carbon atoms such as an alkyl (e.g. methyl, ethyl, propyl), alkenyl (e.g. vinyl or allyl), alkynl (e.g. ethynl), cyclopentyl, cyclohexyl, phenyl etc. and x is 0-2.

As defined above, H-resin is used in this invention to describe resins which may be fully condensed as well as those which are only partially hydrolyzed and/or condensed. Exemplary of fully condensed H-resins are those formed by the process of Frye et al. in U.S. Pat. No. 3,615,272 which is incorporated herein by reference. This polymeric material has units of the formula $(HSiO_{3/2})_n$ in which n is generally 10-1000. The resin has a number average molecular weight of from about 800-2900 and a weight average molecular weight of between about 8000-28,000. When heated sufficiently, this material yields a ceramic coating essentially free of Si—H bonds.

Exemplary of H-resin which may not be fully condensed is that of Banks et al. in U.S. Pat. No. 5,010,159, or that of Frye et al. in U.S. Pat. No. 4,999,397, both of which are incorporated herein by reference. Banks et al. describes a process which comprises hydrolyzing hydridosilanes in an arylsulfonic acid hydrate hydrolysis medium to form a resin which is then contacted with a neutralizing agent. It has recently been discovered that an especially preferred H-resin may be prepared by this method in which the acid/silane ratio is greater than about 2.67:1, preferably about 6/1. This preferred H-resin forms coatings that are substantially crack-free. Frye et al. describes a process which comprises hydrolyzing trichlorosilane in a non-sulfur containing polar organic solvent by the addition of water or HCl and a metal oxide. The metal oxide therein acts as an HCl scavenger and is a continuous source of water. Both of these methods produce resinous hydridosilane hydrolysates which may contain residual silanol (Si—OH) substituents.

Exemplary of H-resin which is not fully hydrolyzed or condensed is that of having units of the formula $HSi(OH)_x(OR)_yO_{z/2}$, in which each R is independently an organic group which, when bonded to silicon through the oxygen atom, forms a hydrolyzable substituent, $x=0-2$, $y=0-2$, $z=1-3$, $x+y+z=3$ and the average value of y over all of the units of the polymer is greater than 0. Exemplary R groups in the above equation include alkyls of 1-6 carbon atoms such as methyl, ethyl, propyl etc., aryls such as phenyl and alkenyls such as vinyl. These resins may be formed by a process which comprises hydrolyzing a hydrocarbonoxy hydridosilane with less than a stoichiometric amount of water in an acidified oxygen-containing polar organic solvent.

Exposure of the H-resin to ammonium hydroxide and/or wet ammonia vapors as taught herein catalyzes both the hydrolysis of the Si—H and any Si—OR bonds to Si—OH as well as the condensation of this material to silica. The silica formed thereby has either no or a very low concentration of Si—H and/or Si—OH. Generally, at least about 70 percent of said Si—H and Si—OH bonds are removed and preferably at least about 95 percent of said Si—H and Si—OH bonds are removed.

The second type of silica precursor materials useful herein are hydrolyzed or partially hydrolyzed compounds of the formula $R_xSi(OR)_{4-x}$ in which R and x are as defined above. Specific compounds of this type include those in which the silicon atom is bonded to groups other than hydrolyzable substituents (i.e., $x=1-2$) such as methyltriethoxysilane, phenyltriethoxysilane, diethyldiethoxysilane, methyltrimethoxysilane, phenyltrimethoxysilane and vinyltrimethoxysilane. Compounds in which $x=2$ are generally not used alone as volatile cyclic structures are generated during pyrolysis, but minor amounts of said compounds may be cohydrolyzed with other silanes to prepare useful preceramic materials. Other compounds of this type include those in which the silicon is solely bound to hydrolyzable substituents (i.e., $x=0$) such as tetramethoxysilane, tetraethoxysilane, tetrapropoxysilane, and tetrabutoxysilane.

The addition of water to a solution of these compounds in an organic solvent results in hydrolysis or partial hydrolysis. Generally, a small amount of an acid or base is used to facilitate the hydrolysis reaction. The resultant hydrolysates or partial hydrolysates may comprise silicon atoms bonded to C, OH or OR groups, but a substantial portion of the material is believed to be condensed in the form of soluble Si—O—Si resins. Treatment of these materials with ammonium hydroxide and/or wet ammonia vapors as taught herein catalyzes further hydrolysis and/or condensation to result in silica with either no or a very low concentration of SiOR and/or SiOH. Generally, at least about 70% of said SiOR and/or SiOH bonds are removed, and preferably at least about 95% of said SiOR and/or SiOH bonds are removed.

Additional silica precursor materials which may function equivalently in this invention include condensed esters of the formula $(RO)_3SiOSi(OR)_3$, disilanes of the formula $(RO)_xR_ySiSiR_y(OR)_x$, compounds containing structural units such as SiOC in which the carbon containing group is hydrolyzable under the thermal conditions, or any other source of SiOR.

The above silica precursor materials are dissolved in a solvent to form a solution for application. Various facilitating Various facilitating measures such as stirring and/or heat may be used to assist in this dissolution. The solvent to be used in the instant invention can be any agent or mixture of agents which will dissolve and stabilize the silica precursor without altering the ceramic coating produced thereby. These solvents can include, for example, alcohols such as ethyl or isopropyl, aromatic hydrocarbons such as benzene or toluene, alkanes such as n-heptane or dodecane, ketones, esters or glycol ethers, in an amount sufficient to dissolve the above materials to low solids. For instance, enough of the above solvent can be included to form a 0.1-50 weight percent solution.

In addition to the above silica precursors, the coating solution may also include a modifying ceramic oxide precursor. The modifying ceramic oxide precursors that can be used herein include compounds of various metals such as aluminum, titanium, zirconium, tantalum, niobium and/or vanadium as well as various non-metallic compounds such as those of boron or phosphorous. The expression "modifying ceramic oxide precursor", therefore, includes such metal and non-metal compounds having one or more hydrolyzable groups bonded to the above metal or non-metal. Examples of hydrolyzable groups include, but are not limited to, alkoxy, such as methoxy, ethoxy, propoxy etc., acyloxy, such as acetoxy, or other organic groups bonded to said metal or non-metal through an oxygen. These compositions must form soluble solutions when mixed with the silica precursors and must be capable of being hydrolyzed, and subsequently pyrolyzed, at relatively low temperatures and relatively rapid reaction rates to form modifying ceramic oxide coatings. When such a modifying ceramic oxide precursor is used, it is generally present in the preceramic mixture in an amount such that the final ceramic coating contains 0.1 to 30 percent by weight modifying ceramic oxide.

If H-resin is to be combined with modifying ceramic oxide precursors in the above coating solution, both materials may simply be dissolved in the solvent and allowed to stand at room temperature for a time sufficient to allow the modifying ceramic oxide precursor to react into the structure of the H-resin. Generally, a period of greater than about 2 hours is necessary for said reaction to occur. The solution may then be applied to the substrate as discussed infra. Alternatively, the modifying ceramic oxide precursor may be hydrolyzed or partially hydrolyzed, dissolved in the solution comprising the solvent and H-resin and then immediately applied to the substrate. Various facilitating measures such as stirring or agitation may be used as necessary to produce said solutions.

If compounds of the formula $R_xSi(OR)_{4-x}$ are to be mixed with modifying ceramic oxide precursors, either or both of these compounds may be hydrolyzed or partially hydrolyzed before or after mixing. For highly reactive modifying ceramic oxide precursors such as compounds with propoxide, isopropoxide, butoxide, isobutoxide or acetylacetonate substituents, it is preferred that the modifying ceramic oxide precursors and compounds of the formula $R_xSi(OR)_{4-x}$ be premixed and heated to reflux in ethanol for 24 hours to afford a homogeneous reaction mixture that can be hydrolyzed uniformly and at a controlled rate. Attempts to hydrolyze a mixture of the above mentioned highly reactive ceramic oxide precursors and compounds of the formula $R_xSi(OR)_{4-x}$ without the pre-reaction step results in preferential and rapid hydrolysis of the modifying ceramic oxide precursor over that of the $R_xSi(OR)_{4-x}$, resulting in rapid, non-homogenous gelation of the reaction mixture.

An alternate method of cohydrolyzing the reactive modifying ceramic oxide precursors and compounds of the formula $R_xSi(OR)_{4-x}$ would be to hydrolyze the $R_xSi(OR)_{4-x}$, followed by adding the reactive modifying ceramic oxide precursor and less than or equal to a stoichiometric amount of water for hydrolyzing said modifying ceramic oxide precursor to the hydrolysate solution. When the hydrolysis of this mixture is facilitated as discussed supra, a uniform, soluble hydrolysate results.

If H-resin is used in the coating solution, a platinum or rhodium catalysts may also be included to increase the rate and extent to which it is converted to a silica coating. Any platinum or rhodium compound or complex that can be solubilized in this solution will be operable. For instance, an organoplatinum composition such as platinum acetylacetonate or rhodium catalyst $RhCl_3[S(CH_2CH_2CH_2CH_3)_2]_3$, obtained from Dow Corning Corporation, Midland, Mich. are all within the scope of this invention. The above catalysts are generally added to the solution in an amount of between about 5 and 500 ppm platinum or rhodium based on the weight of H-resin in solution.

The solution containing the silica precursor, solvent and, optionally, a modifying ceramic oxide precursor and/or a platinum or rhodium catalyst is then coated onto the substrate. The method of coating can be, but is not limited to, spin coating, dip coating, spray coating or flow coating.

The solvent is allowed to evaporate resulting in the deposition of a preceramic coating. Any suitable means of evaporation may be used such as simple air drying by exposure to an ambient environment or by the application of a vacuum or mild heat. It is to be noted that when spin coating is used, an additional drying period is generally not necessary as the spinning drives off the solvent.

The preceramic coating applied by the above methods is then converted to a silica $(SiO_2)$ coating. Several methods for this conversion are possible. In the first embodiment of the invention, the coating is exposed to ammonium hydroxide and then subjected to a temperature sufficient for conversion to silica. This ammonium hydroxide exposure is usually conducted by merely immersing the coated substrate in an ammonium hydroxide solution. Other equivalent methods, however, such as continuously flushing the coating with an ammonium hydroxide solution would function as well. In addition, vacuum infiltration may also be used to increase penetration of the ammonium hydroxide into the coating.

The ammonium hydroxide solution used in this embodiment may be at any concentration desired. Generally, however, a concentrated aqueous solution (28-30%) is preferred since the duration of exposure is thereby shortened. When dilute solutions are to be used, the diluent is generally water.

Exposure to the ammonium hydroxide solution also may be conducted at any temperature and atmospheric pressure desired. Temperatures of from about room temperature (20°-30° C.) up to about the boiling point of the ammonium hydroxide solution and atmospheres from below to above atmospheric pressure are all contemplated herein. From a practical standpoint, however, it is preferred that the exposure occur at about room temperature and at about atmospheric pressure.

The preceramic coating is exposed to the ammonium hydroxide for the time necessary to assist in conversion to a silica coating. Generally, exposures of up to about 2 hours are preferred, with exposures of at least about 15 minutes up to about 2 hours being more preferred and exposures of about 1-2 hours being even more preferred. Longer exposure times may be used herein but the added benefit is generally not significant.

In a second embodiment of this invention, the preceramic coating is exposed to an environment comprising wet ammonia vapors and then subjected to a temperature sufficient for ceramification. As used herein, the term "wet ammonia" is used to describe an environment which comprises both ammonia and water vapors.

Exposure to the above conditions can be by any practical means. For example, the coated substrate may simply be placed in a container and the appropriate environment introduced therein or, alternatively, a stream of the wet ammonia may simply be directed at the preceramic coating. Exclusion of air, oxygen or other gaseous agents during this process is generally preferred, but not necessary.

The method used to generate the wet ammonia environment is also generally not significant. Methods such as bubbling ammonia gas through water or ammonium hydroxide solutions (to control the amount of water vapor present), heating an ammonium hydroxide solution, or heating water and introducing ammonia gas are all functional herein. It is also contemplated that methods which generate ammonia vapors in situ such as the addition of water to amine salts or the addition of water to a silazane such as hexamethyldisilazane will also be effective in the above conversion.

The above exposure can be at any temperature desired from about room temperature up to that used for ceramification. Though higher temperatures usually provide faster results, they also may be responsible for damage to the underlying substrate. Generally, therefore, the temperature is in the range of from about 20° up to about 500° C. with a range of from about 20° up to about 200° C. being preferred.

The preceramic coating should be exposed to the wet ammonia environment for a time sufficient to assist in the conversion of the preceramic coating to silica. Generally, exposures of up to about 4 hours are preferred, with exposures of at least about 15 minutes up to about 4 hours being more preferred and exposures of about 1–3 hours being even more preferred. Though longer exposure times may be used, no significant added benefit is generally obtained.

In a third embodiment of this invention, the coating is exposed to both ammonium hydroxide and a wet ammonia environment prior to subjecting it to a temperature sufficient for ceramification. The exposures in this embodiment of the invention may be either sequential or concomitant and are generally under the same conditions as those described above.

After the preceramic coating is exposed to one of the above environments, it is usually subjected to a temperature sufficient for ceramification. Generally, this temperature is about room temperature or above with a range of from about 20° C. to about 500° C. being preferred, a range of about 20° up to about 200° C. being more preferred and a range of about 20° up to about 190° C. being even more preferred. Higher temperatures usually result in quicker and more complete ceramification, but said temperatures also may have detrimental effects on various temperature sensitive substrates. The preceramic coatings are usually subjected to these temperatures for a time sufficient to ceramify the coating, generally up to about 6 hours, with a range of between about 0.5 and about 6 hours being preferred, and a range of between about 0.5 and 2 hours being more preferred.

The above heating may be conducted at any effective atmospheric pressure from vacuum to superatmospheric and under any effective gaseous environment such as those comprising $O_2$ or an inert gas ($N_2$, etc.). It is especially preferred, however, to heat under a dry ammonia atmosphere to effect removal of any remaining Si—OH groups.

It is also contemplated by the above description that the preceramic coating may be simultaneously exposed to the wet ammonia and/or ammonium hydroxide environment and subjected to a temperature sufficient for ceramification. The time and temperature for said exposure as well as that necessary for said ceramification are generally the same as those described above.

Any method of heating such as the use of a convection oven or radiant or microwave energy is generally functional herein. The rate of heating, moreover, is also not critical, but it is most practical and preferred to heat as rapidly as possible.

In a typical ceramification procedure, the coated substrate which has been exposed to one of the above ammonium hydroxide and/or wet ammonia environments may be placed in a convection oven. The temperature in the oven is then raised to the desired level (such as about 150° C.) and maintained for the desired time (such as about 0.5–2 hours).

By the above methods a thin (less than 2 microns) ceramic planarizing coating is produced on the substrate. The coating smooths the irregular surfaces of various substrates and has excellent adhesion. In addition, the coating may be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings and/or diamond like carbon coatings.

In a dual layer system, the second passivation layer may comprise silicon containing coatings, silicon carbon-containing coatings, silicon nitrogen-containing coatings, silicon carbon nitrogen containing coatings, an additional silicon dioxide and modifying ceramic oxide coating or a diamond-like carbon coating. In a triple layer system, the second passivation layer may comprise silicon carbon-containing coatings, silicon nitrogen-containing coatings, silicon carbon nitrogen containing coatings, an additional silicon dioxide and modifying ceramic oxide coating, or a diamond-like carbon coating and the third barrier coating may comprise silicon coatings, silicon carbon-containing coatings, silicon nitrogen-containing coatings, silicon carbon nitrogen containing coatings, or a diamond-like carbon coating.

The silicon containing coating described above is applied by a method selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, halosilane, halodisilane, halopolysilane or mixtures thereof. The silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or disilacyclobutane as further described in U.S. Pat. No. 5,011,706, which is incorporated herein in its entirety. The silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia, (C) plasma enhanced chemical vapor deposition of a $SiH_4$—$N_2$ mixture such as that described by Ionic Systems or that of Katoh et al. in the Japanese Journal of Applied Physics. vol. 22, #5, pp1321-1323, (D) reactive sputtering such as that described in Semiconductor International, p 34, August 1987 or (E) ceramification of a silicon and nitrogen containing preceramic polymer. The silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and (v) ceramification of a preceramic polymer solution comprising a carbon substituted polysilazane, polysilacyclobutasilazane or polycarbosilane in the presence of ammonia. The diamond-like carbon coatings can be applied by exposing the substrate to an argon beam containing a hydrocarbon in the manner described in NASA Tech Briefs, November 1989 or by one of the methods described by Spear in J. Am. Ceram. Soc.. 72, 171-191 (1989). The silicon dioxide and modifying ceramic oxide coating is applied by the ceramification of a preceramic mixture comprising a silicon dioxide precursor and a modifying ceramic oxide precursor as in the initial coating.

Coatings produced by the instant invention possess low defect density and are useful on electronic devices as protective coatings, as corrosion resistant and abrasion resistant coatings, as temperature and moisture resistant coatings, as dielectric layers in, for instance, multilayer devices and as a diffusion barrier against ionic impurities such as sodium and chloride.

The following non-limiting examples are included so that one skilled in the art may more readily understand the invention.

EXAMPLE 1

H-resin, prepared by the method of Collins et al., U.S. Pat. No. 3,615,272, was diluted to 10 weight percent solids in heptane. To this solution was added 60 ppm Pt (based on H-resin) as $Pt(O_2C_5H_7)_2$. A 1 inch square silicon wafer was coated with this solution and spun at 3000 rpm for 35 seconds. A FTIR of the coating on the wafer showed strong bands at 870 cm$^{-1}$ and 2245 cm$^{-1}$ suggesting the presence of Si—H bonds and a strong band at 1062 cm$^{-1}$ indicating the presence of Si—O—Si bonds.

The coated silicon wafer was immersed in concentrated ammonium hydroxide (28-30%) for 1 hour and then transferred to a Lindberg furnace where it was heated to 185° C. in air for 1 hour. A ceramic coating approximately 1226 angstroms thick with a refractive index of 1.467 was produced. A FTIR of the pyrolyzed coating showed a broad band at 1062 cm$^{-1}$ suggesting the presence of Si—O—Si bonds, a weak band at 870 cm$^{-1}$ indicating a trace of SiH bonds and a weak band at 920 cm$^{-1}$ indicating the presence of a trace amount of Si—OH bonds. Bands indicative of nitrided silica coating were absent.

EXAMPLE 2

A 1 inch square silicon wafer was coated with the same solution and in the same manner as Example 1. The coated silicon wafer was immersed in concentrated ammonium hydroxide (28-30%) for 2 hours and then transferred to a Lindberg furnace where it was heated to 185° C. in wet ammonia atmosphere ($NH_3$ bubbled through water) for 1 hour and then heated at 185° C. for 1 hour in air. A ceramic coating approximately 1367 angstroms thick with a refractive index of 1.458 was produced. A FTIR of the pyrolyzed coating showed a broad band at 1062 cm$^{-1}$ indicating the presence of Si—O—Si bonds. Bands indicative of Si—H, Si—OH or a nitrided silica coating were absent.

EXAMPLE 3

A 1 inch square silicon wafer was coated with the same solution and in the same manner as Example 1. The coated silicon wafer was not immersed in concentrated ammonium hydroxide but it was heated in a Lindberg furnace to 185° C. in wet ammonia atmosphere ($NH_3$ bubbled through water) for 1 hour and then heated for 1 hour in air at 185° C. A ceramic coating approximately 2277 angstroms thick with a refractive index of 1.441 was produced. A FTIR of the pyrolyzed coating showed a broad band at 1062 cm$^{-1}$ indicating the presence of Si—O—Si bonds and only weak bands at 870 cm$^{-1}$ and 920 cm$^{-1}$ indicative of trace amounts of Si—H and Si—OH bonds respectively. Bands indicative of a nitrided silica coating were absent.

EXAMPLE 4

A 1 inch square silicon wafer was coated with the same solution and in the same manner as Example 1. The coated silicon wafer was treated with wet ammonia atmosphere ($NH_3$ bubbled through water) for 1 hour at about room temperature (20°-30° C.). A coating approximately 2550 angstroms thick with a refractive index of 1.432 was produced. A FTIR of the coating showed that 97.7% of the Si—H bonds had been removed.

EXAMPLE 5 (comparative)

A 1 inch square silicon wafer was coated with the same solution and in the same manner as Example 1. The coated silicon wafer was treated at room temperature (20°-30° C.) for 0.5 hour in argon, then 1 hour in dry ammonia, and then another 0.5 hour in argon. A coating approximately 1504 angstroms thick with a refractive index of 1.371 was produced. A FTIR of the coating showed that only 15.4% of the Si—H bonds had been removed.

EXAMPLE 6

5.476 g of triethoxysilane, 8.302 g of isopropyl alcohol and 0.749 g of water containing 3 drops of a 5% aqueous nitric acid solution were combined in a beaker and heated at 60°-80° C. for 45 minutes. 2 g of n butanol was then added to stabilize the resultant partial hydrolysate. 3.258 g of $Al(OCH_2CH_2CH_3)_2(O_2C_5H_7)$ was added to this stabilized partial hydrolysate and the solution was allowed to stand at room temperature for 2 weeks.

A 1 inch square silicon wafer was coated with the preceramic solution formed above and spun at 3000 rpm for 35 seconds. The coated wafer was heated in a Lindberg furnace to 200° C. for 1 hour in a wet ammonia atmosphere ($NH_3$ bubbled through saturated ammonia water) followed by heating to 450° C. for 2 hours in air. A ceramic coating approximately 6598 angstroms thick with a refractive index of 1.480 was produced. A FTIR of the pyrolyzed coating showed a broad band at 1062 $cm^{-1}$ indicating the presence of Si—O—Si bonds and only a weak band 920 $cm^{-1}$ indicative of trace amounts of Si—OH bonds. Bands indicative of Si—H, Si-alkoxy, and nitrided silica were absent.

EXAMPLE 7

4.707 g of tetraethoxysilane, 3.976 g of ethyl alcohol and 9.92 g of water containing 2 drops of a 5% aqueous hydrochloric acid solution were combined in a beaker and heated at 60°-80° C. for 30 minutes. 47.34 g of ethanol was then added to the solution.

A 1 inch square silicon wafer was coated with the preceramic solution formed above and spun at 3000 rpm for 35 seconds. The coated wafer was heated in a Lindberg furnace to 200° C. for 1 hour in a wet ammonia atmosphere ($NH_3$ bubbled through saturated ammonia water) followed by heating to 450° C. for 2 hours in air. A ceramic coating approximately 6392 angstroms thick with a refractive index of 1.463 was produced. A FTIR of the pyrolyzed coating showed a broad band at 1062 $cm^{-1}$ indicating the presence of Si—O—Si bonds and only a weak band 920 $cm^{-1}$ indicative of trace amounts of Si—OH bonds. Bands indicative of Si-alkoxy and nitrided silica were absent.

That which is claimed is:

1. A method of forming a ceramic coating on a substrate comprising:
    coating said substrate with a solution comprising a solvent and hydrogen silsesquioxane resin;
    evaporating said solvent to deposit a preceramic coating on said substrate;
    exposing said preceramic coating to an environment comprising ammonium hydroxide or an environment into which water vapor and ammonia vapor have been introduced; and
    subjecting the preceramic coating to a temperature sufficient to facilitate conversion of said preceramic coating to a ceramic coating.

2. The method of claim 1 wherein the hydrogen silsesquioxane resin is selected from the group consisting of $(HSiO_{3/2})_n$, a polymer having units of the formula $HSi(OH)_aO_{3-x/2}$ and a polymer having units of the formula $HSi(OH)_x(OR)_yO_{z/2}$, wherein each R is independently an organic group which, when bonded to silicon through the oxygen atom, forms a hydrolyzable substituent, $a=0-2$, $x=0-2$, $y=0-2$, $z=1-3$, $x+y+z=3$, n is an integer greater than 3 and the average value of y over all of the units of the polymer is greater than 0.

3. The method of claim 2 wherein the solvent is selected from the group consisting of alcohols, aromatic hydrocarbons, alkanes, ketones, esters or glycol ethers and is present in an amount sufficient to dissolve the hydrogen silsesquioxane to between about 0.1 and about 50 weight percent.

4. The method of claim 3 wherein the preceramic coating is subjected to a temperature of about 20° to about 500° C. for up to about 6 hours.

5. The method of claim 4 wherein the preceramic coating is subjected to a temperature of about 20° to about 500° C. for between about 0.5 about 6 hours.

6. The method of claim 4 wherein the solution also contains a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the ceramic coating contains 0.1 to 30 percent by weight modifying ceramic oxide.

7. The method of claim 4 wherein the solution also contains a platinum or rhodium catalyst in an amount of about 5 to about 500 ppm platinum based on the weight of hydrogen silsesquioxane.

8. The method of claim 6 wherein the solution also contains a platinum or rhodium catalyst in an amount of about 5 to about 500 ppm platinum based on the weight of hydrogen silsesquioxane.

9. The method of claim 4 wherein the preceramic coating is exposed to an environment comprising a concentrated ammonium hydroxide solution and the method of exposure is by immersing the preceramic coating in said concentrated ammonium hydroxide solution.

10. The method of claim 9 wherein the preceramic coating is exposed to the ammonium hydroxide for up to about 4 hours.

11. The method of claim 10 wherein the exposure is for about 1-3 hours at about room temperature.

12. The method of claim 11 wherein the preceramic coating is subjected to a temperature between about 20° and about 200° C. for between about 0.5 and 2 hours.

13. The method of claim 4 wherein the preceramic coating is exposed to an environment into which water vapor and ammonia vapor have been introduced for up to about 4 hours at a temperature of between about 20° C. and about 500° C.

14. The method of claim 13 wherein the exposure is for about 1 to 3 hours at about 20° to about 200° C.

15. The method of claim 14 wherein the preceramic coating is subjected to a temperature between about 20° and about 200° C. for between about 1-2 hours.

16. The method of claim 4 wherein the preceramic coating is sequentially exposed to both concentrated ammonium hydroxide for up to about 4 hours and an environment into which water vapor and ammonia vapor have been introduced for up to about 4 hours.

17. The method of claim 16 wherein the preceramic coating is subjected to a temperature between about 20° and about 200° C. for between about 1-2 hours.

18. The method of claim 1 wherein the preceramic coating is simultaneously exposed to an environment comprising ammonium hydroxide and an environment into which water vapor and ammonia vapor have been introduced and subjected to a temperature sufficient to facilitate conversion of said preceramic coating to a ceramic coating.

19. The method of claim 4 wherein the preceramic coating is subjected to said temperature under an ammonia environment.

20. A method of forming a ceramic coating on a substrate comprising:

coating said substrate with a solution comprising a solvent and hydrolyzed or partially hydrolyzed $R_xSi(OR)_{4-x}$, in which R is an aliphatic, alicyclic or aromatic substituent of 1-20 carbon atoms and x is 0-2;

evaporating said solvent to deposit a preceramic coating on said substrate;

exposing said preceramic coating to an environment comprising ammonium hydroxide or an environment into which water vapor and ammonia vapor have been introduced; and subjecting the preceramic coating to a temperature above room temperature to facilitate conversion of said preceramic coating to a ceramic coating.

21. The method of claim 20 wherein the solvent is selected from the group consisting of alcohols, aromatic hydrocarbons, alkanes, ketones, esters or glycol ethers and is present in an amount sufficient to dissolve the hydrolyzed or partially hydrolyzed $R_xSi(OR)_{4-x}$ to between about 0.1 and about 50 weight percent.

22. The method of claim 21 wherein the preceramic coating is subjected to a temperature of about 20° to about 500° C. for up to about 6 hours.

23. The method of claim 22 wherein the preceramic coating is subjected to a temperature of about 20° to about 500° C. for between about 0.5 about 6 hours.

24. The method of claim 23 wherein the solution also contains a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the ceramic coating contains 0.1 to 30 percent by weight modifying ceramic oxide.

25. The method of claim 22 wherein the preceramic coating is exposed to an environment comprising a concentrated ammonium hydroxide solution and the method of exposure is by immersing the preceramic coating in said concentrated ammonium hydroxide solution.

26. The method of claim 25 wherein the preceramic coating is exposed to the ammonium hydroxide for up to about 4 hours.

27. The method of claim 26 wherein the exposure is for about 1-3 hours at about room temperature.

28. The method of claim 27 wherein the preceramic coating is subjected to a temperature between about 20° and about 200° C. for between about 0.5 and 2 hours.

29. The method of claim 22 wherein the preceramic coating is exposed to an environment into which water vapor and ammonia vapor have been introduced for up to about 4 hours at a temperature of between about 20° C. and about 500° C.

30. The method of claim 29 wherein the exposure is for about 1 to 3 hours at about 20° to about 200° C.

31. The method of claim 30 wherein the preceramic coating is subjected to a temperature between about 20° and about 200° C. for between about 1-2 hours.

32. The method of claim 22 wherein the preceramic coating is sequentially exposed to both concentrated ammonium hydroxide for up to about 4 hours and an environment into which water vapor and ammonia vapor have been introduced for up to about 4 hours.

33. The method of claim 32 wherein the preceramic coating is subjected to a temperature between about 20° and about 200° C. for between about 1-2 hours.

34. The method of claim 20 wherein the preceramic coating is simultaneously exposed to an environment comprising ammonium hydroxide and an environment into which water vapor and ammonia vapor have been introduced and subjected to a temperature above room temperature to facilitate conversion of said preceramic coating to a ceramic coating.

35. The method of claim 22 wherein the preceramic coating is subjected to said temperature under an ammonia environment.

* * * * *